(12) United States Patent
Rahman et al.

(10) Patent No.: US 7,989,144 B2
(45) Date of Patent: Aug. 2, 2011

(54) ANTIREFLECTIVE COATING COMPOSITION

(75) Inventors: M. Dalil Rahman, Flemington, NJ (US); David Abdallah, Bernardsville, NJ (US); Rhuzi Zhang, Pennington, NJ (US); Douglas McKenzie, Easton, PA (US)

(73) Assignee: AZ Electronic Materials USA Corp, Somerville, NJ (US)

( * ) Notice: Subject to any disclaimer, the term of this patent is extended or adjusted under 35 U.S.C. 154(b) by 101 days.

(21) Appl. No.: 12/060,307

(22) Filed: Apr. 1, 2008

(65) Prior Publication Data

US 2009/0246691 A1 Oct. 1, 2009

(51) Int. Cl.
*G03F 7/11* (2006.01)
*G03F 7/30* (2006.01)
*B29C 59/16* (2006.01)
*C08F 291/02* (2006.01)

(52) U.S. Cl. .................. 430/311; 430/272.1; 430/271.1; 264/447; 525/523

(58) Field of Classification Search .................. None
See application file for complete search history.

(56) References Cited

U.S. PATENT DOCUMENTS

| | | | |
|---|---|---|---|
| 3,474,054 A | 10/1969 | White | |
| 3,474,058 A | 10/1969 | Ridgeway at al. | |
| 4,200,729 A | 4/1980 | Calbo | |
| 4,251,665 A | 2/1981 | Calbo | |
| 4,463,162 A | 7/1984 | Nogami et al. | |
| 4,491,628 A | 1/1985 | Ito et al. | |
| 4,719,166 A | 1/1988 | Blevins et al. | |
| 5,187,019 A | 2/1993 | Calbo et al. | |
| 5,294,680 A | 3/1994 | Knors et al. | |
| 5,350,660 A | 9/1994 | Urano et al. | |
| 5,607,824 A | 3/1997 | Fahey et al. | |
| 5,688,598 A * | 11/1997 | Keck et al. | 428/458 |
| 5,747,599 A * | 5/1998 | Ohnishi | 525/327.3 |
| 5,843,624 A | 12/1998 | Houlihan et al. | |
| 5,935,760 A | 8/1999 | Shao et al. | |
| 5,965,679 A | 10/1999 | Godschalx et al. | |
| 5,981,145 A | 11/1999 | Ding et al. | |
| 6,048,956 A * | 4/2000 | Muto et al. | 528/93 |
| 6,121,495 A | 9/2000 | Babb et al. | |
| 6,165,684 A | 12/2000 | Mizutani et al. | |
| 6,228,552 B1 | 5/2001 | Okino et al. | |
| 6,255,394 B1 * | 7/2001 | Onizawa | 525/138 |
| 6,268,072 B1 | 7/2001 | Zheng et al. | |
| 6,316,165 B1 | 11/2001 | Pavelchek et al. | |
| 6,410,208 B1 * | 6/2002 | Teng | 430/302 |
| 6,447,980 B1 | 9/2002 | Rahman et al. | |
| 6,723,488 B2 | 4/2004 | Kudo et al. | |
| 6,737,492 B2 | 5/2004 | Kang et al. | |
| 6,783,916 B2 | 8/2004 | Foster et al. | |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,899,963 B1 | 5/2005 | Zheng et al. | |
| 6,916,590 B2 | 7/2005 | Kaneko et al. | |
| 7,132,216 B2 | 11/2006 | Shao et al. | |
| 7,214,743 B2 | 5/2007 | Hatakeyama et al. | |
| 7,303,855 B2 | 12/2007 | Hatakeyama et al. | |
| 7,816,071 B2 | 10/2010 | Abdallah et al. | |
| 7,932,018 B2 | 4/2011 | McKenzie et al. | |
| 2001/0006759 A1 * | 7/2001 | Shipley et al. | 430/280.1 |
| 2002/0094382 A1 * | 7/2002 | Imai et al. | 427/282 |
| 2003/0180559 A1 | 9/2003 | Wayton et al. | |
| 2004/0219453 A1 | 11/2004 | Pavelchek et al. | |
| 2005/0007016 A1 | 1/2005 | Mori et al. | |
| 2005/0058929 A1 | 3/2005 | Kennedy et al. | |
| 2005/0095434 A1 * | 5/2005 | Hirota et al. | 428/414 |
| 2005/0186444 A1 | 8/2005 | Zheng et al. | |

(Continued)

FOREIGN PATENT DOCUMENTS

EP 0 845 486 A1 * 6/1998

(Continued)

OTHER PUBLICATIONS

Guo, L.Jay, "Nanoimprit Lithography: Methods and Material Requirements**", Acvanced materiasl, vol. 19, No. 4, 2007, pp. 495-813, published online Jan. 25, 2007 at http://www3.interscience.wiley.com/journal/114096023/abstract?CRETRY=1&SRETRY=0.*

English translation of JP, 10-273635, A (1998) from machine translation from AIPN Japan Patent Office National center for Industrial Property Information and Training, generated May 17, 2010, 7 pages.*

387673, epoxy/hydroxy functaionalized average MW~2,600, average MN~1,300, from http://www.sigmaaldrich.com/catalog/ProductDetail.do?lang=en&N4=387673|ALDRICH&N5=SEARCH_ . . . , printed out May 24, 2010., 2 pages From SIGMA-ALDRICH catalog online.*

(Continued)

*Primary Examiner* — Cynthia Hamilton
(74) *Attorney, Agent, or Firm* — Sangya Jain

(57) ABSTRACT

The present invention relates to an antireflective composition comprising a thermal acid generator and an epoxy polymer comprising at least one unit of structure 1, at least one unit of structure 2,

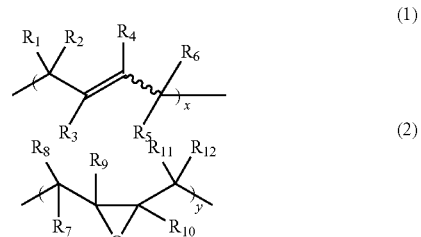

where, $R_1$ to $R_{12}$ are independently selected from hydrogen and $C_1$-$C_4$ alkyl, structure 1 has a configuration selected from cis, trans or mixture thereof, and x and y are the mole % of the monomeric units in the polymer. The invention also relates to a process for manufacturing a microelectronic device.

18 Claims, 2 Drawing Sheets

U.S. PATENT DOCUMENTS

| | | |
|---|---|---|
| 2005/0282091 A1 | 12/2005 | Hatakeyama |
| 2006/0017774 A1 | 1/2006 | Beak |
| 2006/0177774 A1 | 8/2006 | Abdallah et al. |
| 2006/0204891 A1 | 9/2006 | Hatakeyama |
| 2006/0222999 A1 | 10/2006 | Miyazaki et al. |
| 2006/0234158 A1 | 10/2006 | Hatakeyama |
| 2006/0275696 A1 | 12/2006 | Zampini et al. |
| 2007/0057253 A1 | 3/2007 | Gronbeck et al. |
| 2007/0287298 A1 | 12/2007 | Ishibashi et al. |
| 2008/0160461 A1 | 7/2008 | Yoon et al. |
| 2008/0292987 A1 | 11/2008 | Houlihan et al. |
| 2008/0292995 A1 | 11/2008 | Houlihan et al. |
| 2008/0305441 A1 | 12/2008 | Yoon et al. |
| 2009/0136242 A1 | 5/2009 | Okamoto et al. |
| 2009/0176165 A1 | 7/2009 | Cheon et al. |
| 2009/0280435 A1 | 11/2009 | McKenzie et al. |
| 2010/0119979 A1 | 5/2010 | Rahman et al. |
| 2010/0119980 A1 | 5/2010 | Rahman et al. |
| 2010/0151392 A1 | 6/2010 | Rahman et al. |
| 2010/0316949 A1 | 12/2010 | Rahman et al. |

FOREIGN PATENT DOCUMENTS

| | | |
|---|---|---|
| EP | 0 933 681 A1 * | 8/1999 |
| EP | 1 085 529 A2 * | 3/2001 |
| EP | 1 705 519 A2 | 9/2006 |
| EP | 1 829 942 A1 | 9/2007 |
| EP | 1 845 416 A2 | 10/2007 |
| JP | 62-230843 A | 10/1987 |
| JP | 63-51419 A | 3/1988 |
| JP | 10-273635 A * | 10/1998 |
| JP | 11-249311 A | 9/1999 |
| JP | 2002-14474 A | 1/2002 |
| JP | 2003-82070 A | 3/2003 |
| JP | 2005-43471 A | 2/2005 |
| WO | WO 2008/082241 A1 | 7/2008 |
| WO | WO 2008/120855 A1 | 10/2008 |

OTHER PUBLICATIONS

Form PCT/IB/326, Form PCT/IB/373, and Form PCT/ISA/237 for PCT/IB2008/001284 dated Dec. 3, 2008, which corresponds to U.S. Appl. No. 11/872,962.
Form PCT/ISA/220, Form PCT/ISA/210, and Form PCT/ISA/237 for PCT/IB2009/005147 dated Jul. 22, 2009, which corresponds to U.S. Appl. No. 12/115,776.
Form PCT/ISA/220, Form PCT/ISA/210, and Form PCT/ISA/237 for PCT/IB2009/005186 dated Jul. 14, 2009, which corresponds to U.S. Appl. No. 12/270,189.
Form PCT/ISA/220, Form PCT/ISA/210, and Form PCT/ISA/237 for PCT/IB2009/005185 dated Jul. 14, 2009, which corresponds to U.S. Appl. No. 12/270,256.
H. Harada et al, "Progress of Hard Mask Material for Multi-layer stack application", SPIE vol. 6519, pp. 65190N-1—pp. 65190N-9 (2007).
Nishimura et al, Comparison of single-, bi-, and tri-layer resist process, SPIE vol. 5753, pp. 611—pp. 618 (2005).
Eng. Lang. Abstract of XP002503793 retrieved from STN Database accession No. 1999:587958, Database CA [Online] Chemical Abstracts Services, Columbus, Ohio, USA, (Sep. 20, 1999).
English Language Abstract of XP002503795 retrieved from Database WPI Week accession No. 1999-57548 [49], Thomson Scientific, London, GB (1999).
English Language Abstract from JPO of JP 62-230843 A, Printed Apr. 10, 2008.
Eng. Lang. Abstract of XP0025003794 retrieved from STN Database Accession No. 1988: 205733, Database CA [Online] Chemical Abstracts Services, Columbus, Ohio, USA, (Jun. 11, 1998).
English Language Abstract from JPO of JP 63-51419 A, pRINTED Mar. 25, 2010.
Engl. Lang. Abstract of XP002504600 retrieved from STN Database Accession No. 2002:47842, Database CA [Online] Chemical Abstracts Services, Columbus, Ohio, USA, (Jan. 18, 2002).
Office Action mail date Mar. 6, 2009 for U.S. Appl. No. 11/752,040.
Office Action mail date Dec. 16, 2009 for U.S. Appl. No. 11/872,962.
Office Action mail date Dec. 23, 2009 for U.S. Appl. No. 12/115,776.
Form PCT/ISA/220, Form PCT/ISA/220, and Form PCT/ISA/237 for PCT/IB2008/001284 dated Dec. 2, 2008, which corresponds to U.S Appl. No. 11/872,962.
U.S. Appl. No. 12/270,189, filed Nov. 13, 2008, Rahman et al.
U.S. Appl. No. 12/270,256, filed Nov. 13, 2008, Rahman et al.
U.S. Appl. No. 12/332,501, filed Dec. 11, 2008, Rahman et al.
U.S. Appl. No. 12/482,189, filed Jun. 10, 2009, Rahman et al.
U.S. Appl. No. 12/646,191, filed Dec. 23, 2009, Rahman et al.
Office Action mail dated Jul. 28, 2010 for U.S. Appl. No. 11/872,962.
Office Action mail date Jul. 12, 2010 for U.S. Appl. No. 12/115,776.
Office Action mail date Aug. 5, 2010 for U.S. Appl. No. 12/270,189.
Communication pursuant to Article 94(3) EPC (EPO Form 2001) for EP 08 751 011.1 dated Aug. 11, 2010, which corresponds to U.S. Appl. No. 11/872,962.
Advisory Action mail dated Oct. 15, 2010 for U.S. Appl. No. 11/872,962.
Advisory Action mail dated Nov. 18, 2010 for U.S. Appl. No. 11/872,962.
Communication pursuant to Article 94(3) EPC (EPO Form 2001) for EP 08 751 011.1 dated Mar. 25, 2010, which corresponds to U.S. Appl. No. 11/872,962.
Form PCT/IB/326, Form PCT/IB/373, and Form PCT/ISA/237 for PCT/IB2009/005147 dated Nov. 18, 2010, which corresponds to U.S. Appl. No. 12/115,776.
Office Action dated Nov. 9, 2010 for U.S. Appl. No. 12/332,501.
Form PCT/ISA/220, Form PCT/ISA/210, and Form PCT/ISA/237 for PCT/162010/001401 dated Sep. 23, 2010, which corresponds to U.S. Appl. No. 12/482,189.
Notice of Allowance and Fee(s) Due dated Dec. 23, 2010 for U.S. Appl. No. 12/115,776.
Office Action mail date Oct. 8, 2010 for U.S. Appl. No. 12/270,256.
Form PCT/ISA/220, Form PCT/ISA/210, and Form PCT/ISA/237 for PCT/IB2010/001401 dated Sep. 23, 2010, which corresponds to U.S. Appl. No. 12/482,189.
Final Office Action mail date Mar. 22, 2011 for U.S. Appl. No. 12/270,189.
Office Action dated Jan. 14, 2011 for U.S. Appl. No. 12/270,256.
Office Action mail date Apr. 12, 2011 for U.S. Appl. No. 11/872,962.
Notice of Allowance and Fee(s) Due mail date May 11, 2011 for U.S. Appl. No. 11/872,962.
Communication pursuant to Article 94(3) EPC for EP 09 742 415.4 dated May 20, 2011, which corresponds to U.S. Appl. No. 12/115,776.
Form PCT/IB/326, Form PCT/IB/373, and Form PCT/ISA/237 for PCT/IB2009/005186 dated May 26, 2011, which corresponds to U.S. Appl. No. 12/270,189.
Form PCT/LB/326, Form PCT/IB/373, and Form PCT/ISA/237 for PCT/IB2009/005185 dated May 26, 2011, which corresponds to U.S. Appl. No. 12/270,256.
Office Action dated Jun. 8, 2011 for U.S. Appl. No. 12/482,189.

* cited by examiner

Figures 1 to 26: Examples of the aliphatic moiety.

ANTIREFLECTIVE COATING COMPOSITION

FIELD OF INVENTION

The present invention relates to an absorbing antireflective coating composition comprising a polymer with fused aromatic rings, in the backbone of the polymer and a second unsaturated polymer, and a process for forming an, image using the antireflective coating composition. The process is especially useful for imaging photoresists using radiation in the deep and extreme ultraviolet (uv) region.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates and to provide better masking properties during dry etching. An antireflective coating coated beneath a photoresist and above a reflective substrate provides significant improvement in lithographic performance of the photoresist. Typically, the bottom antireflective coating(s)/underlayer(s) are applied on the substrate and then a layer of photoresist is applied on top of the antireflective coating. The antireflective coatings are cured to prevent intermixing between the antireflective coatings and also between the top antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques. In cases where the photoresist does not provide sufficient dry etch resistance, underlayer is or antireflective coatings for the photoresist that act as a hard mask and are highly etch resistant during substrate etching are preferred, and one approach has been to incorporate silicon into a layer beneath the organic photoresist layer. Additionally, another high carbon content antireflective or mask layer is added beneath the silicon antireflective layer, which is used to improve the lithographic performance of the imaging process. The silicon layer may be spin coatable or deposited by chemical vapor deposition. Silicon is highly etch resistant in processes where $O_2$ etching is used, and by providing a organic mask layer with high carbon content beneath the silicon antireflective layer, a very large aspect ratio can be obtained in the substrate pattern. Thus, the organic high carbon mask layer can be much thicker than the photoresist or silicon layer above it. The organic mask layer can be used as a thicker film and can provide better substrate etch masking that the original photoresist. Thus there is a need for better antireflective layers and underlayers which provide superior lithographic properties, especially those with high carbon content.

SUMMARY OF THE INVENTION

The present invention relates to an antireflective composition comprising a thermal acid generator and an epoxy polymer comprising at least one unit, of structure 1, at least one unit of structure 2,

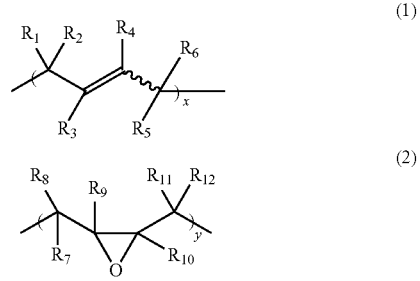

where, $R_1$ to $R_{12}$ are independently selected from hydrogen and $C_1$-$C_4$ alkyl, structure 1 has a configuration selected from cis, trans or mixture thereof, and x and y are the mole % of the monomeric units in the polymer. The invention also relates to a process for manufacturing a microelectronic device.

DESCRIPTION OF THE INVENTION

Figure 1:
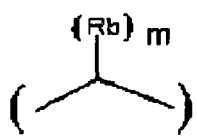
FIGS. 1 to 26 shows examples of alkylene comonomeric units.

The present invention relates to a novel organic spin coatable mask layer and antireflective coating composition comprising a polymer, where the polymer comprises at least one unit with an unsaturated bond in the backbone of the polymer which is not in conjugation with other unsaturated bonds, and at least one epoxy group in the backbone of the polymer. The invention also relates to a process for imaging a photoresist layer coated above the novel antireflective coating layer.

The novel composition of the present invention comprises a thermal acid generator and an epoxy polymer comprising at least one unit of structure 1, and at least one unit of structure 2,

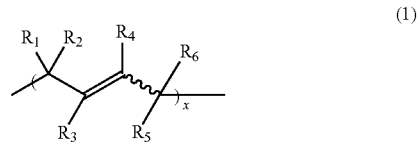

-continued

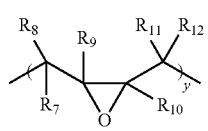
(2)

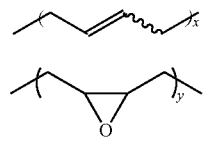
(5)

(6)

where, $R_1$ to $R_{12}$ are independently selected from hydrogen and $C_1$-$C_4$ alkyl, and x and y are the mole % of the monomeric units in the polymer. The unit with structure (1) may have a configuration selected from cis, trans or mixtures thereof, about the double bond; ~~~ refers to the positioning of the double bond such that it is configured to be in the cis or trans position. That is, unit (1) has a structure which refers to isomers with structures (1)a, (1)b or mixture of these.

where, structure 5 has a configuration selected from cis, trans or mixtures thereof, and x and y are the mole % of the monomeric units in the polymer. The end groups in this embodiment may be of units 3 and/or 4, particularly where X is hydroxy.

More specifically the end groups may be of structure 7 and/or 8,

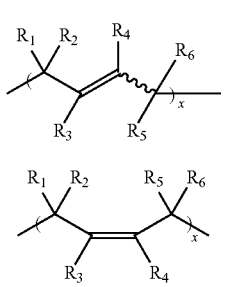
(1)a (1)b

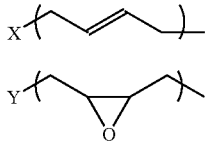
(7)

(8)

where X and Y are hydroxy or H. In one case X and Y are hydroxy.

The polymer may further be exemplified by the structure 9,

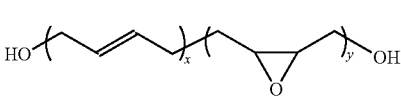
(9)

The double bond in the unit of structure 1 is isolated, that is, it is not conjugated with another double bond. Thus, the carbon atom with pendant groups, $R_5$ and $R_6$, is saturated, where $R_5$ and $R_6$ are selected from hydrogen and $C_1$-$C_4$ alkyl. The isolated double bond allows a specific absorption band to be generated in the vicinity of 193 nm, making the novel composition suitable for 193 nm imaging. The unit with structure (2) is an aliphatic polymeric backbone with an epoxy group. The epoxy group may be formed by the epoxidation of the double bond, for example, epoxidation of the structure of unit 1. The present polymer comprising units of structure 1 and 2, may further comprise end groups of structures, 3 and 4, where x and y are the mole % of the monomeric units in the polymer. In one embodiment, x is about 70% and y is about 30%, further where the cis isomer is about 15% and the trans isomer is about 55% and the weight average molecular weight is about 2,600. The polymer may be an epoxy/hydroxy functionalized polybutadiene. Other embodiments of the polymer may be hydroxy functionalized polybutadiene.

In the epoxy polymer the mole % of the unit of structure 1 may range from about 65 to about 85, preferably 60 to about 80. The mole % of the unit of structure 2 may range from 40 to about 20 preferably 35 to about 1.5. Within the total amount of structure 1, the cis isomer may range from 10% to about 30% and the trans isomer may range from 70% to about 90%. The weight average molecular weight of the polymer may range from about 1.500 to about 50,000, preferably 2,000 to about 20,000. The polymer may have an n (refractive index) value in the range of about 1.7 to about 1.8 at 193 nm; the polymer has a k (absorbance) value in the range from about, 0.15 to about 0.35 at 193 nm. The carbon content of the epoxy polymer is greater than 75 weight %, preferably greater than 80 weight %, as measured by elemental analysis.

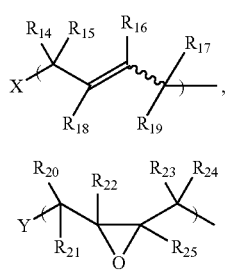
(3)

(4)

where, $R_{14}$ to $R_{25}$ is independently selected from hydrogen and $C_1$-$C_4$ alkyl, and X and Y are independently OH or H. ~~~ refers to the cis or trans configuration of the double bond in unit 3. The polymer may have a cis, trans or mixture of unit (3). In one embodiment of the polymer in the composition, the polymer comprises units, 1, 2, 3 and/or 4, where X and/or Y are hydroxy, such polymers provide improved solubility in polar organic solvents.

One embodiment of the polymer of the composition is where the polymer comprises units of structures 5 and 6, The polymer may be synthesized by polymerizing butadiene and then epoxidized. The epoxidization compound may be metachloroperbenzoic acid.

The antireflective composition of the present invention comprises a thermal acid generator, the epoxy polymer described previously and may further comprise a second polymer. The second polymer may be an aromatic polymer comprising fused aromatic rings either pendant from the backbone of the polymer or in the backbone of the polymer. The second polymer may also have different n and k values from the epoxy polymer, which may allow for blending of the epoxy polymer and the second polymer to give desirable values for n and k. The second polymer may have a n (refractive index) value in the range of about 1.4 to about; 1.6 at 193 nm; the polymer may have, a k (absorbance) value in the range from about 0.2 to about 0.5 at 193 nm.

In one embodiment of the second polymer, the second polymer may be an acrylate polymer with a chromophore of at least 2 fused rings pendant from the backbone of the polymer, for example naphthyl and/or anthracyl group. The monomeric units may be derived from monomers such as 9-anthracenylmethyl methacrylate, 2-hydroxypropylmethacrylate, acetoxyethyl methacrylate, n-butylmethacrylate and their equivalents. An example is poly(9-anthracenylmethyl methacrylate/2-hydroxypropylmethacrylate/acetoxyethyl methacrylate/n-butylmethacrylate).

In another embodiment of the second polymer, the second polymer may comprise at least 3 fused rings in the backbone of the polymer. The fused aromatic unit may have in the range of about 3 to about 8 aromatic rings. The second polymer is described in U.S. application Ser. Nos. 11/752,040 and 11/872,962, both of which are incorporated herein by reference. The second polymer of the novel composition comprises at least one unit with three or more fused aromatic rings in the backbone of the polymer and at least one unit with an aliphatic moiety in the backbone of the polymer. Other comonomeric units may also be present, such as substituted or unsubstituted phenyl, or substituted or unsubstituted naphthyl. In one embodiment the polymer may be free of any phenyl or single ring aromatic moiety. The fused aromatic rings provide the absorption for the coating, and are the absorbing chromophore. The fused aromatic rings of the polymer can comprise substituted or unsubstituted 6 membered aromatic rings which have a common bond to form a fused ring structure, such as units exemplified by structures 10-15 and their isomers,

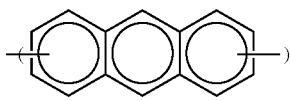

10

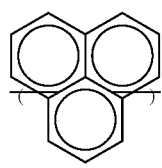

11

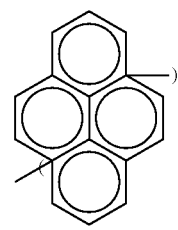

12

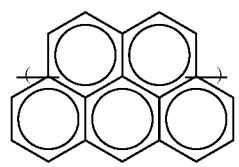

13

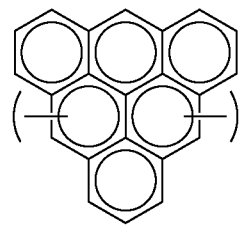

14

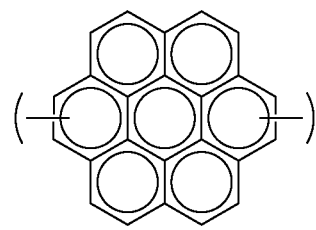

15

The fused rings may be exemplified by anthracene, phenanthrene, pyrene, fluoranthene, coronene triphenylene and their substituted derivatives.

The fused rings may form the backbone of the second polymer at any site in the aromatic structure and the attachment sites may vary within the polymer. The fused ring structure can have more than 2 points of attachment forming a branched oligomer or branched polymer. In one embodiment of the present invention the number of fused aromatic rings may vary from 3-8, and in other embodiment of the polymer it comprises 4 or more fused aromatic rings, and more specifically the polymer may comprise pyrene as shown in structure 12. The fused aromatic rings may comprise one or more hetero-aromatic rings, where the heteroatom may, be nitrogen or sulfur, as illustrated by structure 16.

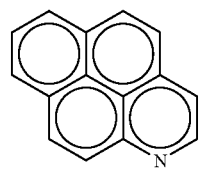

16

In one embodiment of the second polymer, the polymer comprises the fused aromatic unit described previously and further, in order to isolate the chromophore, the fused aromatic unit is connected to an aliphatic carbon moiety. The fused aromatic rings of the polymer may be unsubstituted or substituted with one or more organo substituents, such as alkyl, alkylaryl, ethers, haloalkyls, carboxylic acid, ester of carboxylic acid, alkylcarbonates, alkylaldehydes, ketones. Further examples of substituents are —$CH_2$—OH, —$CH_2$Cl, —$CH_2$Br, —$CH_2$Oalkyl, —$CH_2$—O—C=O(alkyl), —$CH_2$—O—C=O(O-alkyl), —CH(alkyl)-OH, —CH(alkyl)-Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-$CO_2$H, alkyl-C=O(O-alkyl), -alkyl-OH, -alkyl-halo, -alkyl-O—C=O(alkyl), -alkyl-O—C=O(O-alkyl), alkyl-HC=O. In one embodiment of the polymer, the fused aromatic group is free of any pendant moiety containing nitrogen. The substituents on the aromatic rings may aid in the solubility of the polymer in the coating solvent. Some of the substituents on the fused aromatic structure may also be thermolysed during curing, such that they may not remain in the cured coating and may still give a high carbon content film useful during the etching process. The fused aromatic groups are more generally illustrated by structures 10' to 15', where R$_a$ is an organo substituent, such as hydrogen, hydroxy, hydroxy alkylaryl, alkyl, alkylaryl, carboxylic acid, ester of carboxylic acid, etc., and n is the number of substituents on the rings. The substituents, n, may range from 1-12. Typically n can range from 1-5, where Ra, exclusive of hydrogen, is a substituent independently selected from groups such as alkyl, hydroxy, hydroxyalkyl, hydroxyalkylaryl, alkylaryl, ethers, haloalkyls, alkoxy, carboxylic acid, ester of carboxylic acid, alkylcarbonates, alkylaldehydes, ketones. Further examples of substituents are —CH$_2$—OH, —CH$_2$Cl, —CH$_2$Br, —CH$_2$Oalkyl, —CH$_2$—O—C=O(alkyl), —CH$_2$—O—C=O(O-alkyl), —CH(alkyl)-OH, —CH(alkyl)-Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-CO$_2$H, alkyl-C=O(O-alkyl), -alkyl-OH, -alkyl-halo, -alkyl-O—C=O(alkyl), -alkyl-O—C=O(O-alkyl), alkyl-HC=O.

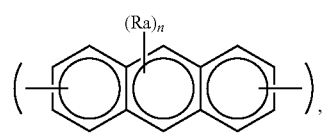

10'

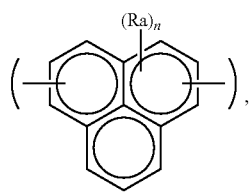

11'

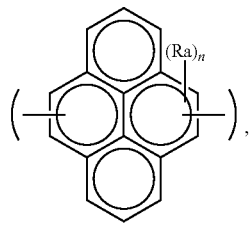

12'

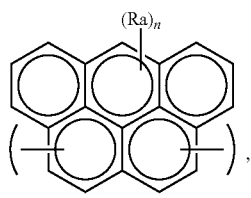

13'

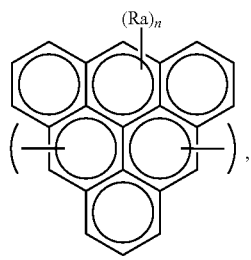

14'

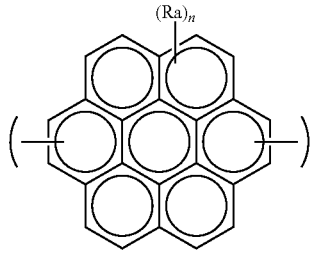

15'

The polymer may comprise more than one type of the fused aromatic structures described herein.

In addition to the fused aromatic unit described above, the second polymer of the novel antireflective coating further comprises at least one unit with an essentially aliphatic moiety in the backbone of the polymer, and the moiety is any that has a nonaromatic structure that forms the backbone of the polymer, such as an alkylene which is primarily a carbon/hydrogen nonaromatic moiety.

Figure 2:
Figure 3:
Figure 4:
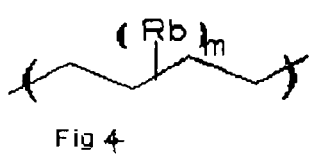
Figure 5:
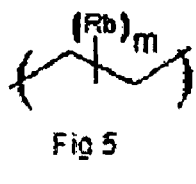
Figure 6:
Figure 7:
Figure 8:
Figure 9:
Figure 10:
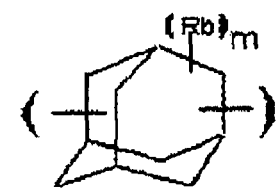
Figure 11:
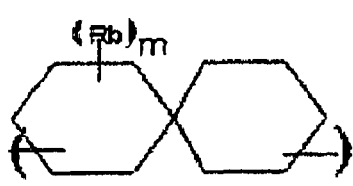
Figure 12:
Figure 13:
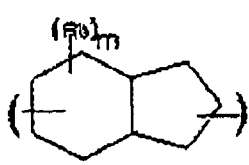
Figure 14:
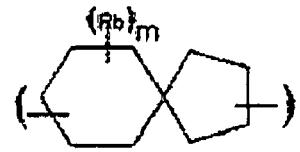
Figure 15:
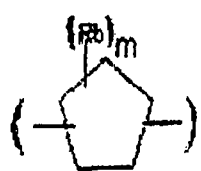
Figure 16:
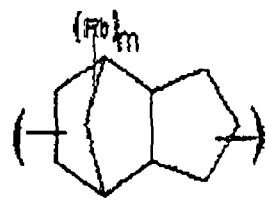
Figure 17:
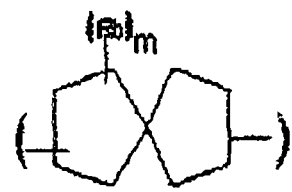
Figure 18:
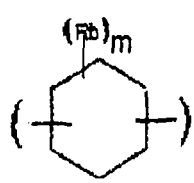
Figure 19:
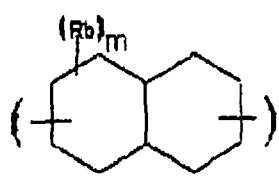
Figure 20:
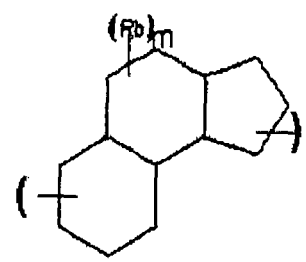
Figure 21:
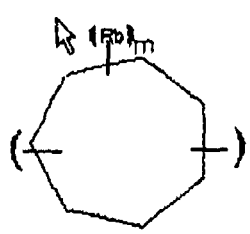
Figure 22:
Figure 23:
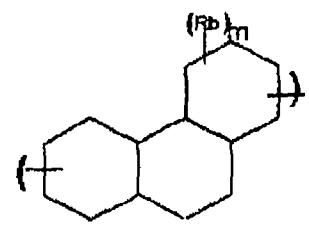
Figure 24:
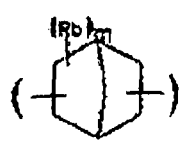
Figure 25:
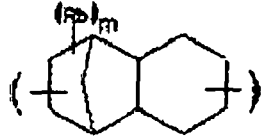
Figure 26:
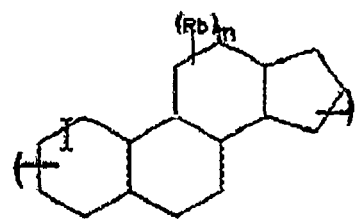

The polymer can comprise at least one unit which forms only an aliphatic backbone in the polymer, and the polymer may be described by comprising units, -(A)- and -(B)-, where A is any fused aromatic unit described previously, which may be linear or branched, and where B has only an aliphatic backbone. B may further have pendant substituted or unsubstituted aryl or aralkyl groups or be connected to form a branched polymer. The alkylene, aliphatic moiety in the polymer may be selected from a moiety which is linear, branched, cyclic or a mixture thereof. Multiple types of the alkylene units may be in the polymer. The alkylene backbone unit may have some pendant groups present, such as hydroxy, hydroxyalkyl, alkyl, alkene, alkenealkyl, alkylalkyne, alkyne, alkoxy, aryl, alkylaryl, aralkyl ester, ether, carbonate, halo (e.g. Cl, Br). Pendant groups can impart useful properties to the polymer. Some of the pendant groups may be thermally eliminated during curing to give a polymer with high carbon content, for example through crosslinking or elimination to form an unsaturated bond. Alkylene groups such as hydroxyadamantylene, hydroxycyclohexylene, olefinic cycloaliphatic moiety, may be present in the backbone of the polymer. These groups can also provide crosslinking sites for crosslinking the polymer during the curing step. Pendant groups on the alkylene moiety, such as those described previously, can enhance solubility of the polymer in organic solvents, such as coating solvents of the composition or solvents useful for edge bead removal. More specific groups of the aliphatic comonomeric unit are exemplified by adamantylene, dicyclopentylene, and hydroxy adamantylene. The structures of some of the alkylene moieties are given in FIGS. 1 to 26, where R$_b$ is independently selected from hydrogen, hydroxy, hydroxyalkyl, alkyl, alkylaryl, ethers, halo, haloalkyls, carboxylic acid, ester of carboxylic acid, alkylcarbonates, alkylaldehydes, ketones, and other known substituents, and m is the number of substituents. The number, m, may range from 1-40, depending on the size of the unit. Different or the same alkylene group may be connected together to form a block unit and this block unit may be then connected to the unit comprising the fused aromatic rings. In some cases a block copolymer may be formed, in some case a random copolymer may be formed, and in other cases alternating copolymers may be formed. The copolymer may comprise at least 2 different aliphatic comonomeric units. The copolymer may comprise at least 2 different fused aromatic moieties. In one embodiment the polymer may comprise at least 2 different aliphatic comonomeric units and at least 2 different fused aromatic moieties. In another embodiment of the invention the polymer comprises at least one fused aromatic unit and aliphatic unit(s) free of aromatics. In one embodiment of the unit with the aliphatic group, the cycloalkylene group is selected from a biscycloalkylene group, a triscycloalkylene group, a tetracycloalkylene group in which the linkage to the polymer backbone is through the cyclic structure and these cyclic structures form either a monocyclic, a dicyclic or tricyclic structure. In another embodiment of the second polymer, the polymer comprises a unit with the fused aromatic rings and a unit with an aliphatic moiety in the backbone, where the aliphatic moiety is a mixture of unsubstituted alkylene and a substituted alkylene where the substituent may be hydroxy, carboxylic acid, carboxylic ester, alkylether, alkoxy alkyl, alkylaryl, ethers, haloalkyls, alkylcarbonates, alkylaldehydes, ketones and mixtures thereof.

In another embodiment of the second polymer, it comprises at least one unit with 3 or more fused aromatic rings in the backbone of the polymer, at least one unit with an aliphatic moiety in the backbone of the polymer, and at least one unit comprising a group selected from a substituted phenyl, unsubstituted phenyl, unsubstituted biphenyl, substituted biphenyl, substituted naphthyl and unsubstituted naphthyl. The fused aromatic ring with 3 or more aromatic units and the aliphatic moiety are as described herein. The polymer may be free of any pendant moiety containing nitrogen. The polymer may be free of any pendant moiety containing nitrogen, in one embodiment. The substituents on the phenyl, biphenyl and naphthyl may be at least one polar group that increases the solubility of the polymer in a polar solvent, such as ethyl lactate, propyleneglycol monomethyether acetate (PGMEA) and propyleneglycol monomethyether (PGME). Examples of substituents are hydroxy, hydroxyalkyl, halide, etc. The phenyl, biphenyl or naphthyl group may form part of the backbone or be attached to the polymer backbone directly or through a linking group such as a adamantyl group, ethylene group, etc., and where examples of monomeric units may be derived from monomers such as hydroxystyrene, phenol, naphthol, and hydroxynaphthylene. The incorporation of phenol and/or naphthol moieties in the polymer backbone is preferred for films with high carbon content. The amount of the substituted phenylene, unsubstituted phenylene, unsubstituted biphenylene, substituted biphenylene, substituted naphthylene or unsubstituted naphthylene may range from about 5 mole % to about 50 mole % in the polymer, or from about 20 mole % to about 45 mole % in the polymer. Compositions comprising polymers of the present invention which further comprise phenolic and/or naphthol groups are useful when the coating solvent of the composition is PGMEA or a mixture of PGMEA and PGME. Compositions comprising polymers of the present invention which further comprise phenolic and/or naphthol groups are also useful when the excess composition is to be removed with an edgebead remover, especially where the edgebead remover comprises PGMEA or a mixture of PGMEA and PGME. Other edgebead removers comprising ethyl lactate may also be used. In one embodiment the composition comprises a polymer comprising at least one unit with 3 or more fused aromatic rings in the backbone of the polymer, at least one unit with an aliphatic moiety in the backbone of the polymer, and at least one unit comprising a group selected from phenol, naphthol and mixtures thereof. Pyrene, as the fused aromatic moiety, may be used. The composition may further contain a solvent comprising PGMEA. Other additives, as described herein, may be used in the composition.

The second polymer of the present novel composition may be synthesized by reacting a) at least one aromatic compound comprising 3 or more fused aromatic rings capable of electrophilic substitution such that the fused rings form the backbone of the polymer, with b) at least one essentially aliphatic compound. The aromatic compound may be selected from monomers that provide the desired aromatic unit, more specifically structures 10-15 or 10'-15' or equivalents, and may be further selected from compounds such as anthracene, phenanthrene, pyrene, fluoranthene, and coronene triphenylene. The fused aromatic rings provide at least 2 reactive hydrogens which are, sites for electrophilic, substitution. The aliphatic compound is an essentially linear, branched or cyclic substituted or unsubstituted alkyl compound capable of forming the aliphatic unit in the polymer, and also capable of forming a carbocation in the presence of an acid, and may be selected from compounds such as aliphatic diol, aliphatic triol, aliphatic tetrol, aliphatic alkene, aliphatic diene, etc. Any compound that is capable of forming the alkylene unit in the polymer of the novel composition as described previously may be used. The aliphatic monomer may be exemplified by 1,3-adamantanediol, 1,5-adamantanediol, 1,3,5-adamantanetriol, 1,3,5-cyclohexanetriol, and dicyclopentadiene. Other monomers may also be added into the reaction mixture, such as phenol and/or naphthol. The reaction is catalysed in the presence of a strong acid, such as a sulfonic acid. Any sulfonic acid may be used, examples of which are triflic acid, nonafluorobutane sulfonic acid, bisperfluoroalkylimides, trisperfluoroalkylcarbides, or other strong nonnucleophilic acids. The reaction may be carried out with or without a solvent. If a solvent is used then any solvent capable of dissolving the solid components may be used, especially one which is non-reactive towards strong acids; solvents such as chloroform, bis(2-methoxyethyl ether), nitrobenzene, methylene chloride, and diglyme may be used. The reaction may be mixed for a suitable length of time at a suitable temperature, till the polymer is formed. The reaction time may range from about 3 hours to about 24 hours, and the reaction temperature may range from about 80° C. to about 180° C. The polymer is isolated and purified in appropriate solvents, such as methanol, cyclohexanone, etc., through precipitation and washing. Known techniques of reacting, isolating and purifying the polymer may be used. The weight average molecular weight of the second polymer can range from about 1,000 to about 50,000, or about 1300 to about 20,000. The carbon content of the second polymer is greater than 80% as measured by elemental analysis, preferably greater than 85%.

The novel composition of the present invention comprises a thermal acid generator, the epoxy polymer, an optional second polymer and may further comprise a crosslinker. Typically the crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple electrophilic sites, are capable of crosslinking with the polymer. Examples of compounds which can be crosslinkers are, 1,3 adamantane diol, 1,3,5 adamantane triol, polyfunctional reactive benzylic compounds, tetramethoxymethyl-bisphenol (TMOM-BP) of structure (17), aminoplast crosslinkers, glycolurils, polymeric glycolurils, Cymels, Powderlinks, etc.

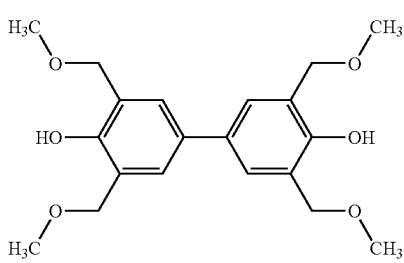

17

The novel composition comprising the epoxy polymer may also comprise an acid generator, an optional second polymer, and an optional crosslinker. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylakylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diarlyiodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including, those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

In one embodiment of the novel composition, it comprises the epoxy polymer, the second polymer, the thermal acid generator and the crosslinker, as described herein.

The novel composition, as described above may further contain at least one of the known photoacid, generators, examples of which without limitation, are onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid.

The antireflection coating composition of the present invention may contain 1 weight % to about 15 weight % of the fused aromatic polymer, and preferably 4 weight % to about 10 weight %, of total solids. The weight of the epoxy polymer in the composition is about 25 weight % to about 5 weight %, or about 30 weight % to about 65 weight %, or about 40 weight % to about 60 weight %. The crosslinker, when used in the composition, may be present at about 1 weight % to about 30 weight % of total solids. The acid generator, may be incorporated in a range from about 0.1 to about 10 weight % by total solids of the antireflective coating composition, preferably from 0.3 to 5 weight % by solids, and more preferably 0.5 to 2.5 weight % by solids.

The solid components of the antireflection coating composition are mixed with a solvent or mixtures, of solvents that dissolve the solid components of the antirefletive coating. Suitable solvents for the antireflective coating composition may include, for example, a glycol ether derivative such as ethyl cellosolve, methyl cellosolve propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate, carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition may comprise other components, which may be added to enhance the performance of the coating, e.g. monomeric dyes, lower alcohols ($C_1$-$C_6$ alcohols), surface leveling agents, adhesion promoters, antifoaming agents, etc.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The absorption parameter (k) of the novel composition ranges from about 0.05 to about 1.0, preferably from about 0.1 to about 0.8 at the exposure wavelength, as derived from ellipsometric measurements. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. The n and k values can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.05 to about 0.75, and for 248 nm the preferred range for k is about 0.15 to about 0.8. In one embodiment the composition has a k value in the range of about 0.2 to about 0.5 and n value in the range of about 1.50 to about 1.70 at 193 nm.

The carbon content of the novel antireflective coating composition is greater than 80 weight % or greater than 85 weight % as measured by elemental analysis.

The antireflective coating composition is coated on the substrate using techniques well known to those skilled in the art, such as dipping, spin coating or spraying. The film thickness of the antireflective coating ranges from about 15 nm to about 400 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 90° C. to about 280° C.

Other types of antireflective coatings may be coated above the coating of the present invention. Typically, an antireflective coating which has a high resistance to oxygen etching, such as one, comprising silicon groups, such as siloxane, functionalized siloxanes, silsesquioxanes, or other moieties that reduce the rate of etching, etc., is used so that the coating can act as a hard mask for pattern transference. The silicon coating can be spin coatable or chemical vapor deposited. In one embodiment the substrate is coated with a first film of the novel composition of the present invention and a second coating of another antireflective coating comprising silicon is coated above the first film. The second coating can have an absorption (k) value in the range of about 0.05 and 0.5. A film of photoresist is then coated over the second coating.

A film of photoresist is coated on top of the uppermost antireflective coating and baked to substantially remove the photoresist solvent. An edge bead remover may be applied after all the coating steps (antireflective coatings and photoresist) to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 1.93 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist, that are obtained by free radical polymerization of maleic anhydride and unsaturated cyclic, monomers. Any of the known types of 193 nm photoresists may be used, such as those described in, U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent, monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. The novel coatings can also be used in nanoimprinting and e-beam lithography.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide (TMAH). The developer may further comprises surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings. With the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the method's of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer.

The molecular weight of the polymers was measured on a Gel Permeation Chromatograph.

Example 1

Synthesis of Poly(Anthracene-co-1-Naphthol-co-Phenol-co-Adamantanyl)

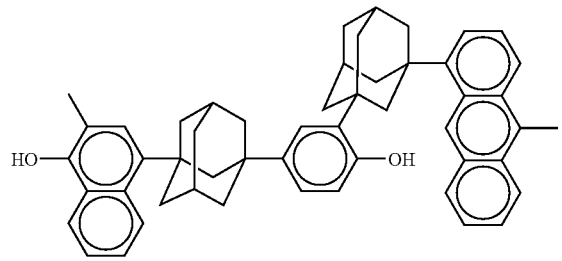

Anthracene (8.9 g~0.05 mole) and 1,3-adamantane diol (16.8 g~0.1 mole), 1-naphthol (7.2 g~0.1 mole) and phenol (9.4 g 0.1 mole) were taken into a 500 mL 4 neck round bottomed flask equipped with stirrer, condenser, Dean Stark trap, Thermo watch and $N_2$ sweep. 140 g of diglyme and 40 g of cyclopentyl methyl ether were added, mixed for 10 minutes under nitrogen and 1.50 g of trifluoromethane sulphonic acid was added. The flask was heated to reflux at 140° C., for three hours. After the reaction, the flask was cooled to room temperature. The reaction mixture was mixed with 1.4 liters of methanol and a precipitate was formed. The precipitate was filtered through a Buckner Funnel and dried under vacuum. The crude polymer was redissolved in cyclopentyl methyl ether, washed with water three times and then drowned in 1.5 liters of hexane. A precipitate was formed, filtered, washed with hexane and dried under vacuum. 20.0 g of the polymer was obtained. The yield of the polymer was 50%, and the weight average molecular weight, Mw, was 2946, with a polydispersity of 1.57.

Example 2

0.75 g of polymer from Example 1 was mixed with 0.75 g of polybutadiene, epoxy/hydroxyl functionalized (CAS #129288-65-9) available from Aldrich (Sigma-Aldrich, St. Louis, Mo.), 0.15 g of tetramethoxymethyl bisphenol, 0.60 g of perfluorobutane sulphonic acid triethyl amine at 10% solid in ArF Thinner (70:30 PGME:PGMEA), and 12.75 g of ArF Thinner were added. After shaking overnight the formulation was filtered using 0.2 μm filter.

Example 3

N & K Measurement: The formulation from Example 2 was adjusted to 1.25% solid with ArF Thinner and the mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. Then, n and k values were measured with a VASE Ellipsometer manufactured by J. A. Woollam Co. Inc. The optical constants n and k of the film for 193 nm radiation were, n=1.623, k=0.3.6.

Example 4 and 5

Examples 2 and 3 were repeated to give Examples 4 and 5, respectively, and n & k values were measured, n=1.620, k=0.36.

Examples 6 and 7

The filtered solutions from Examples 2 and 4 were each spin-coated on a 4" silicon wafer at 2000 rpm. The coated wafers were, baked on hotplate at 250° C. for 60 seconds. After bake, the wafers were cooled to room temperature and partially submerged in PGME for 30 seconds. The two halves of the wafer were examined for changes in film thickness. For both compositions of Example 2 and 4, no film loss was observed, due to sufficient crosslinking.

Example 8

0.75 g of polymer from Example 1 was mixed with 0.75 g of poly(9-anthracenylmethyl methacrylate/2-hydroxypropylmethacrylate/acetoxyethyl methacrylate/n-butylmethacrylate, with feed ratio of 0.70 mole/1.54 mole/0.07 mole/0.07 mole) 0.15 g of tetramethoxymethyl bisphenol, 0.60 g of perfluorobutane sulphonic acid triethyl amine at 10% solid in ArF Thinner, and 12.75 g of ArF Thinner were added. After shaking over night the formulation was filtered with 0.2 μm filter.

Example 9

N & K Measurement: The formulation from Example 8 was adjusted to 1.25% solid with ArF Thinner and the mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. Then, n and k values were measured with a VASE Ellipsometer manufactured by J. A. Woollam Co. Inc. The optical constants n and k of the film for 193 nm radiation were, n=1.51, k=0.31.

Examples 10

This filtered solution from Example 9 was spin-coated on a 4" silicon wafer at 2000 rpm. The coated wafer was baked on hotplate at 250° C. for 60 seconds. After bake, the wafer was cooled to room temperature and partially submerged in PGME for 30 seconds. The two halves of the wafer were examined for changes in film thickness. No film loss was observed due to sufficient crosslinking.

Example 11

Synthesis of
Poly(pyrene-co-Phenol-co-Adamantane))

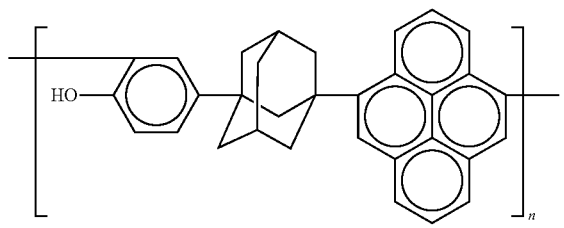

Pyrene (20.25 g~0.1 mole) and 1,3-Adamantane diol (16.8 g~0.1 mole), phenol (9.41 g~0.1 mole) were taken in a 500 mL 4 Neck RB flask, equipped with stirrer, condenser, Dean Stark trap, Thermo watch and $N_2$ sweep. 140 g of diglyme and 40 g of cyclopentyl methyl ether were added, mixed for 10 minutes under nitrogen and 1.50 g of trifluoromethane sulphonic, acid was added. The flask was heated to reflux at 140° C., for three hours. After the reaction, the flask was cooled to room temperature. The reaction mixture was drowned in 1.4 liters of methanol; a precipitate was formed, which was filtered through Buckner Funnel and dried under vacuum. The crude polymer was redissolved in cyclopentyl methyl ether and washed with water three times and then drowned in 1.5 liters of hexane; a precipitate was formed, filtered washed with hexane and dried under vacuum. 9.8 g of polymer was formed with a 450% yield.

Example 12

0.75 g of polymer from Example 11 was mixed with 0.75 g of polybutadiene, epoxy/hydroxyl functionalized (CAS #129288-65-9) from Aldrich, 0.15 g of tetramethoxymethyl bisphenol, 0.60 g of perfluorobutane sulphonic acid triethyl amine at 10% solid in ArF Thinner, and 12.75 g of ArF Thinner were added. After shaking over night the formulation was filtered with 0.2 μm filter.

Example 13

N & K Measurement: The formulation from Example 12 was adjusted to 1.25% solid with ArF Thinner and the mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. Then, n and k values were measured with a VASE Ellipsometer manufactured by J. A. Woollam Co. Inc. The optical constants n and k of the film for 193 nm radiation were, n=1.63, k=0.39.

Examples 14

The homogeneous solution from Example 12 was filtered with 0.2 μm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer were examined for changes in film thickness. No film loss was observed due to sufficient crosslinking.

Example 15

0.75 g of polymer from Example 1 was mixed with 0.75 g of polybutadiene, epoxy/hydroxyl functionalized (CAS #129288-65-9) from Aldrich 0.15 g of tetramethoxymethyl bis phenol, 0.045 g of diphenyliodonium salt with 4,4,5,5,6,6-hexafluorohydro-4H-1,3,2-dithiazine 1,1,3,3-tetraoxide in ArF Thinner, and 13.83 g g of ArF Thinner were added. After shaking over night the formulation was filtered by 0.2 μm filter.

Example 16

N & K Measurement: The formulation from Example 15 was adjusted to 1.25% solid with ArF Thinner and the mixture was allowed to mix until all the materials become soluble. The homogeneous solution was filtered with 0.2 μm membrane filter. This filtered solution was spin-coated on a 4" silicon wafer at 200 rpm. The coated wafer was baked on a hotplate at 250° C. for 60 seconds. Then, n and k values were measured with a VASE Ellipsometer manufactured by J. A. Woollam Co. Inc. The optical constants n and k of the film for 193 nm radiation were, n=1.623, k=0.36.

Examples 17

The homogeneous solution from Example 15 was filtered with 0.2 μm membrane filter. This filtered solution was spin-coated, on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer were examined for changes in film thickness. No film loss was observed due to sufficient crosslinking.

Example 18

0.75 g of polymer from example 1 was mixed with 0.75 g of polybutadiene, epoxy/hydroxyl functionalized (CAS #129288-65-9) from Aldrich, 0.15 g of tetramethoxymethyl bis phenol, 0.045 g of bis t-butyldiphenyliodonium salt with 4,4,5,5,6,6-hexafluorohydro-4H-1,3,2-dithiazine 1,1,3,3-tetraoxide in ArF Thinner, and 13.83 g g of ArF Thinner were added. After shaking over night the formulation was filtered with 0.2 μm filter.

Example 19

N & K Measurement: The formulation from Example 18 was adjusted to 1.25% solid with ArF Thinner and the mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. Then, n and k values were measured with a VASE. Ellipsometer manufactured by J. A. Woollam Co. Inc. The optical constants n and k of the film for 193 nm radiation were, n=1.623, k=0.36.

Examples 20

The homogeneous solution from Example 18 were filtered with 0.2 μm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer were examined for changes in film thickness. No film loss was observed due to sufficient crosslinking.

Example 21

0.759 g of polymer from Example 1 was mixed with 0.75 g of polybutadiene, epoxy/hydroxyl functionalized (CAS #129288-65-9) from Aldrich, 0.15 g of tetramethoxymethyl bis phenol, 0.045 g of diphenyliodonium trifluoromethanesulfonate in ArF Thinner, and 13.83 g g of ArF Thinner were added. After shaking over night the formulation was filtered by 0.2 μm filter.

Example 22

N & K Measurement: The formulation from Example 21 was adjusted to 1.25% solid with ArF Thinner and the mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. Then, n and k values were measured with a VASE Ellipsometer manufactured by J. A. Woollam Co. Inc. The optical constants n and k of the film for 193 nm radiation were, n=1.623, k=0.36.

Examples 23

The homogeneous solution from Example 21 was filtered with 0.2 μm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer were examined for changes in film thickness. No film loss was observed due to sufficient crosslinking.

Example 24

0.75 g of polymer from Example 1 was mixed with 0.75 g of polybutadiene, epoxy/hydroxyl functionalized (CAS #129288-65-9) from Aldrich, 0.15 g of tetramethoxymethyl, bis phenol, 0.045 g of diphenyliodoniumperfluorobutane sulphonate in ArF Thinner, and 13.83 g g of ArF Thinner were added. After shaking over night the formulation was filtered by 0.2 μm filter.

Example 25

N & K Measurement: The formulation from Example 24 was adjusted to 1.25% solid with ArF Thinner and the mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. Then, n and k values were measured with a VASE Ellipsometer manufactured by J. A. Woollam Co. Inc. The optical constants n and k of the film for 193 nm radiation were, n=1.623, k=0.36.

Examples 26

The homogeneous solution from Example 24 was filtered with 0.2 μm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer were examined for changes in film thickness. With effective crosslinking, no film loss was observed.

Example 27

0.75 g of polymer from Example 1 was mixed with 0.75 g of polybutadiene, epoxy/hydroxyl functionalized (CAS #129288-65-9) from Aldrich, 0.15 g of tetramethoxymethyl, bis phenol, 0.045 g of t-Butylbisphenyliodonium trifluoromethane sulphonate in ArF Thinner, and 13.83 g of ArF Thinner were added. After shaking over night the formulation was filtered by 0.2 μm filter.

Example 28

N & K Measurement: The formulation from Example 27 was adjusted to 1.25% solid with ArF Thinner and the mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. Then, n and k values were measured with a VASE Ellipsometer manufactured by J. A. Woollam Co. Inc. The optical, constants, n and k of the film for 193 nm radiation were, n=1.623, k=0.36.

Examples 29

The homogeneous solution from Example 27 was filtered with 0.2 μm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer were examined for changes in film thickness. No film loss was observed due to sufficient crosslinking.

Example 30

Blanket etch rates of the coatings of the antireflective coatings were measured on a NE-5000 N (ULVAC) using both an oxidative and a fluorocarbon-rich etch condition outlined in Table 1. The antireflective coating film (Example 15) and the 193 nm photoresist AZ® AX1120P (available from AZ® Electronic Materials, Somerville, N.J., USA) with about 250 nm thickness were coated separately on 8 in silicon wafers, baked at 240° C. for 1 minute. Individual film thickness measuring programs on a Nanospec 8000 using Cauchy's material-dependent constants derived by VASE analysis of the films and a 5 point inspection were performed before and after a 20 second etch. Etch rates were then calculated by taking the film thickness difference-divided by etch times.

Etch rate masking potential is revealed in the etch rate data in Table 2 and 3 below. The inventive Example 15 shows desirable slower etch rate in both conditions relative to the photoresist.

TABLE 1

Etch conditions used in the blanket etch rate studies

| Etch condition | Oxidative condition | Fluorocarbon condition |
|---|---|---|
| Gas | $Cl_2/O_2/Ar$, 24/6/25 SCCM | $CF_4/O_2/Ar$, 50/20/150 SCCM |
| Process Pressure | 1.6 Pa | 5 Pa |

Plate temperature: 20° C.; RF power: 500 W with 50 W bias.

TABLE 2

Etch rate using Oxidative condition.

| Formulation | Etch rate (nm/s) | Relative etch rate |
|---|---|---|
| Example 15 | 3.93 | 0.62 |
| AX1120P | 6.30 | 1.00 |

TABLE 3

Etch rate using Fluorocarbon condition

| Formulation | Etch rate (nm/s) | Relative etch rate |
|---|---|---|
| Example 15 | 3.0 | 0.76 |
| AX1120P | 3.9 | 1.00 |

Example 31

An 8 inch wafer coated with 500 nm of chemically vapor deposited $SiO_2$ was coated with the composition from Example 15 to give a 200 nm film thickness at 1,500 rpm, and baked at 230° C. for 60 second. A silicon containing bottom antireflective coating, AZ EXP ArF S24H (available from AZ® Electronic Materials USA Corps, Somerville, N.J.) was coated over the coating from Example 15, to give a 35 nm film thickness and baked at 230° C., for 60 second. AZ ArF1120P photoresist (available from AZ Electronic Materials) was then coated on top of the antireflective coatings to give a 150 nm film thickness and soft baked at 100° C. for 30 seconds. The photoresist was exposed imagewise using a 193 nm exposure tool (Nikon NSR-306D: NA=0.85, Annular 0.80/0.63), baked at 110° C. for 60 second and then developed in 0.26N aqueous tetramethyl ammonium hydroxide (TMAH) solution. The line and space patterns were then observed on a scanning electron microscope and a pattern with critical dimension of 80 nm, with a 1:1 pitch was analyzed. The photoresist had a photosensitivity of 29.0 mJ/cm² and had very good exposure latitude of 8.32%. The pattern can be transferred to the substrate using the etch conditions described in Example 30.

The invention claimed is:

1. An antireflective composition comprising a thermal acid generator and an epoxy polymer comprising at least one unit of structure 1, and at least one unit of structure 2,

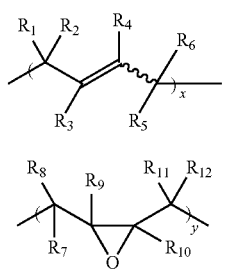

where, $R_1$ to $R_{12}$ are independently selected from a group consisting of hydrogen and $C_1$-$C_4$ alkyl, and structure 1 has a configuration selected from a group consisting of cis, trans and mixture thereof, and x and y are the mole % of the monomeric units in the polymer, and where the composition further comprises a second absorbing polymer comprising fused aromatic unit in the backbone of the polymer and a multicyclic aliphatic unit in the backbone of the polymer.

2. The antireflective composition of claim 1, where the second absorbing polymer has a carbon content greater than 80 weight %.

3. The antireflective composition of claim 1, where the epoxy polymer further comprises at least one end unit selected from structures (3) and (4)

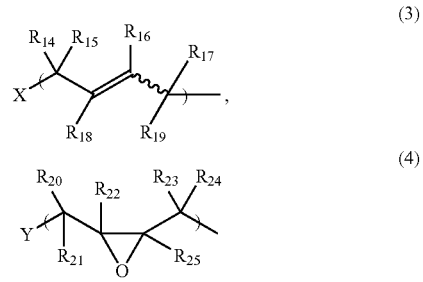

where, $R_{14}$ to $R_{25}$ is independently selected from a group consisting of hydrogen and $C_1$-$C_4$ alkyl, and X is OH or H.

4. The antireflective composition of claim 1, where the composition has a carbon content of greater than 75 weight %.

5. The antireflective composition of claim 1, where the epoxy polymer has the structural units (3) and (4),

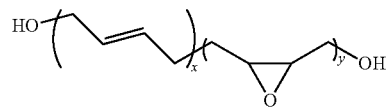

where, structure 4 has cis or trans configuration, and x and y are the mole % of the monomeric units in the polymer.

6. The antireflective composition of claim 1, where the epoxy polymer is

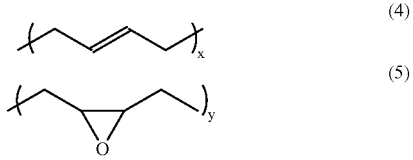

where x and y are the mole % of the monomeric units in the polymer.

7. The antireflective composition of claim 1, where the epoxy polymer has a carbon content of greater than 75 weight %.

8. The antireflective composition of claim 1, where the epoxy polymer has a refractive index in the range of about 1.7 about 1.8 at 193 nm.

9. The antireflective composition of claim 1, where the epoxy polymer has a absorbance in the range from about 0.15 to about 0.35 at 193 nm.

10. The antireflective composition of claim 1, where the second polymer further comprises a unit selected from a group consisting of hydroxyphenylene, hydroxynaphthlene and mixtures thereof.

11. The antireflective composition of claim 1, further comprising a crosslinker.

12. The antireflective composition of claim 11, where the crosslinker is selected from a group consisting of melamines, methylols, glycolurils, polymeric gycolurils, hydroxy alkyl amides, epoxy resins, epoxy amine resins, blocked isocyanates, and divinyl monomers.

13. The antireflective composition of claim 1, where the thermal acid generator is selected from a group consisting of iodonium salts, tosylates, derivatives of benzene sulfonic acid salts, and derivatives of naphthalene sulfonic acid salts.

14. A process for manufacturing a microelectronic device, comprising;
    a) providing a substrate with a first layer of an antireflective coating composition from claim 1;
    b) optionally, providing at least a second antireflective coating layer over the first antireflective coating composition layer;
    c) coating a photoresist layer above the antireflective coating layers;
    d) imagewise exposing the photoresist layer with radiation;
    e) developing the photoresist layer with an aqueous alkaline developing solution.

15. The process of claim 14, where the second antireflective coating comprises silicon.

16. The process of claim 14, where the photoresist layer is imageable with radiation from about 240 nm to about 12 nm.

17. A process for manufacturing a microelectronic device, comprising;
    a) providing a substrate with a first layer of an antireflective coating composition from claim 1;
    b) optionally, providing at least a second antireflective coating layer over the first antireflective coating composition layer;
    c) coating a photoresist layer above the antireflective coating layers; and,
    d) imaging the photoresist by nanoimprinting.

18. An antireflective composition comprising a thermal acid generator and an epoxy polymer comprising at least one unit of structure 1, and at least one unit of structure 2,

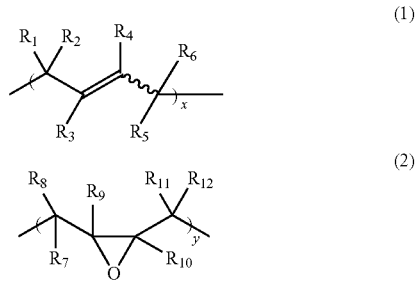

where, $R_1$ to $R_{12}$ are independently selected from a group consisting of hydrogen and $C_1$-$C_4$ alkyl, and structure 1 has a configuration selected from a group consisting of cis, trans and mixture thereof, and x and y are the mole % of the monomeric units in the polymer, and where the composition further a second polymer which comprises a fused aromatic unit in the backbone of the polymer where the fused aromatic unit has in the range of about 3 to about 8 aromatic rings.

* * * * *